(12) United States Patent
Higashi

(10) Patent No.: US 6,169,010 B1
(45) Date of Patent: Jan. 2, 2001

(54) METHOD FOR MAKING INTEGRATED CIRCUIT CAPACITOR INCLUDING ANCHORED PLUG

(75) Inventor: Gregg Sumio Higashi, Orlando, FL (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/364,208

(22) Filed: Jul. 30, 1999

(51) Int. Cl.$^7$ .................................................. H01L 21/20
(52) U.S. Cl. .................... 438/396; 438/253; 438/254; 438/238; 438/239; 438/381; 438/396; 438/397; 438/399; 257/306
(58) Field of Search ................................ 438/396, 253, 438/254, 238, 239

(56) References Cited

U.S. PATENT DOCUMENTS

| | | | |
|---|---|---|---|
| 4,507,852 | * 4/1985 | Karulkar | 29/590 |
| 4,714,686 | * 12/1987 | Sander et al. | 437/195 |
| 4,879,257 | * 11/1989 | Patrick | 437/193 |
| 5,312,775 | * 5/1994 | Fujii et al. | 437/192 |
| 5,408,130 | * 4/1995 | Woo et al. | 257/758 |
| 5,619,071 | * 4/1997 | Myers et al. | 257/765 |
| 5,854,105 | * 12/1998 | Tseng | 438/253 |
| 5,854,734 | * 12/1998 | Sandhu et al. | 361/321.5 |
| 5,903,493 | 5/1999 | Lee | 365/149 |

\* cited by examiner

Primary Examiner—Matthew Smith
Assistant Examiner—Belur Keshavan
(74) Attorney, Agent, or Firm—Allen, Dyer, Doppelt, Milbrath & Gilchrist, P.A.

(57) ABSTRACT

A method for making an integrated circuit capacitor includes forming an interconnection line adjacent a substrate, forming a first dielectric layer on the interconnection line, forming a first opening in the first dielectric layer, and forming a second opening in the interconnection line aligned with the first opening and having an enlarged width portion greater than a width of the first opening. The method further includes filling the first and second openings with a conductive metal to define a metal plug having a body portion and an anchor portion adjacent lower portions of the first dielectric layer. The method also includes forming a trench in the first dielectric layer adjacent the body portion of the metal plug, forming a first electrode lining the trench and contacting the metal plug, and forming a second dielectric layer on the first electrode, and forming a second electrode on the second dielectric layer. Because the metal plug is anchored, a depth of the trench can be greater without the metal plug becoming loose and separating from the underlying interconnection line.

39 Claims, 3 Drawing Sheets

METHOD FOR MAKING INTEGRATED CIRCUIT CAPACITOR INCLUDING ANCHORED PLUG

RELATED APPLICATION

This application is based upon prior filed copending provisional application No. 60/TBD filed Jan. 26, 1999, the entire disclosure of which is incorporated herein by reference.

FIELD OF THE INVENTION

The present invention relates to the field of semiconductor devices, and, more particularly, to a method for making a capacitor.

BACKGROUND OF THE INVENTION

Capacitors are used extensively in electronic devices for storing an electric charge. A capacitor includes two conductive plates or electrodes separated by an insulator. The capacitance, or amount of charge held by the capacitor per applied voltage, depends upon the area of the plates, the distance between them, and the dielectric value of the insulator. Capacitors may be formed within a semiconductor device, such as, for example, a dynamic random access memory (DRAM) or an embedded DRAM.

As semiconductor memory devices become more highly integrated, the area occupied by the capacitor of a DRAM storage cell shrinks, thus decreasing the capacitance of the capacitor because of its smaller electrode surface area. However, a relatively large capacitance is desired to prevent loss of stored information. Therefore, it is desirable to reduce the cell dimension and yet obtain a high capacitance, which achieves both high cell integration and reliable operation.

One technique for increasing the capacitance while maintaining the high integration of the storage cells is directed toward the shape of the capacitor electrodes. In this technique, the polysilicon layer of the capacitor electrodes may have protrusions, fins, cavities, etc., to increase the surface area of the capacitor electrode, thereby increasing its capacitance while maintaining the small area occupied on the substrate surface.

Instead of forming the capacitor on the substrate surface, capacitors are also formed above the substrate, i.e., they are stacked above the substrate. The surface area of the substrate can then be used for forming transistors. With respect to increasing the capacitance of a stack capacitor, U.S. Pat. No. 5,903,493 to Lee discloses a capacitor formed above a tungsten plug. The surface area of the capacitor is increased by etching a trench in the dielectric layer around the tungsten plug. The tungsten plug interfaces with an underlying interconnection line, thus allowing different layers formed above the substrate to be connected.

The trench is patterned by conventional etching or other suitable techniques. The fundamental limit on how far the trench can be etched is determined by how well the tungsten plug is anchored or secured within the dielectric layer. Typically, the depth of the trench is limited to about one half the thickness of the dielectric layer. After the trench has been etched, a capacitor is formed above the tungsten plug. Unfortunately, if the trench is etched beyond one half the thickness of the dielectric, the tungsten plug is more likely to become loose and fall out. This physical separation between the tungsten plug and the underlying metal interconnection with the interconnection line can cause open circuits to be formed resulting in complete failure of the device or circuit incorporating the capacitor.

SUMMARY OF THE INVENTION

In view of the foregoing background, it is therefore an object of the present invention to provide a method for making a capacitor having an increased capacitance without reducing the reliability thereof.

This and other advantages, features and objects in accordance with the present invention are provided by a method for making an integrated circuit capacitor including an anchored metal plug. More particularly, the method comprises the steps of forming an interconnection line adjacent a substrate, forming a first dielectric layer on the interconnection line, forming a first opening in the first dielectric layer, and forming a second opening in the interconnection line aligned with the first opening and having an enlarged width portion greater than a width of the first opening. The method further comprises filling the first and second openings with a conductive metal to define a metal plug having a body portion and an anchor portion adjacent lower portions of the first dielectric layer. The body portion and the anchor portion are preferably formed as a monolithic unit.

Because the metal plug is anchored, a depth of the trench can be greater without the metal plug becoming loose and separating from the underlying interconnection line. If this were to occur, an open circuit would occur resulting in failure of the device or circuit incorporating the integrated circuit capacitor. The anchor portion of the metal plug thus allows the depth of trench to be increased to thereby increase the capacitance, and without reducing the reliability of the integrated circuit capacitor.

The method also preferably includes forming a trench in the first dielectric layer adjacent the body portion of the metal plug, forming a first electrode lining the trench and contacting the metal plug, forming a second dielectric layer on the first electrode, and forming a second electrode on the second dielectric layer. Increasing the depth of the trench in accordance with the present invention increases the surface area of the first and second electrodes. This advantageously increases the capacitance of the capacitor, which is desired for preventing a loss of stored information.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
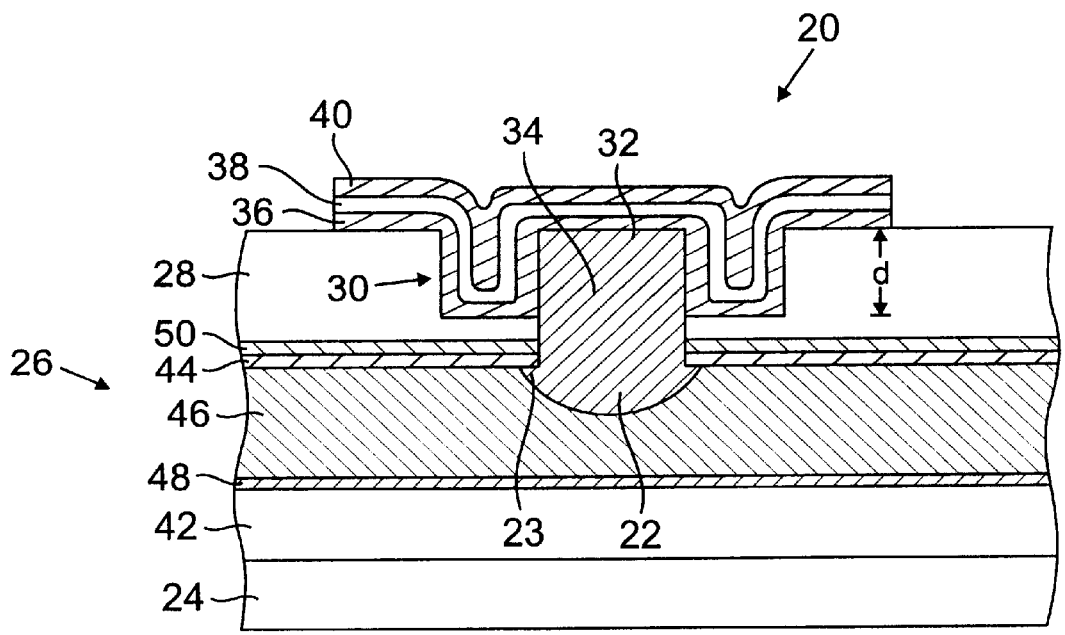
FIG. 1 is a cross-sectional view of an integrated circuit capacitor including an anchored metal plug in accordance with the present invention.

Referring initially to FIG. 1, a cross-sectional view of an integrated circuit capacitor 20 including an anchored metal plug 32 is now described. The integrated circuit capacitor 20 is formed on a substrate 24 with an interconnection line 26 adjacent the substrate, and a first dielectric layer 28 is on the interconnection line. The first dielectric layer 28 includes a trench 30 therein. The trench 30 is formed adjacent the metal plug 32 allowing the capacitor 20 to occupy a greater surface area, thus increasing its capacitance.

The metal plug 32 includes a body portion 34 extending upwardly into the trench 30, and an anchor portion 22 connected to the body portion and extending into the interconnection line 26. The anchor portion 22 has an enlarged width portion 23 to anchor the metal plug 32 adjacent lower portions of the first dielectric layer 28. Because the metal plug 32 is anchored, a depth d of the trench 30, for example, can be greater than half the thickness of the first dielectric layer 28 without the metal plug becoming loose and separating from the underlying interconnection line 26. If this were to occur, an open circuit would occur resulting in failure of the device or circuit incorporating the integrated circuit capacitor 20.

The integrated circuit capacitor 20 includes first and second electrodes 36, 40 and a second dielectric layer 38 therebetween. The first electrode 36 lines the trench 30 and contacts the metal plug 32. The second dielectric layer 38 overlies the first electrode 36, and the second electrode 40 overlies the second dielectric layer. As semiconductor devices become more highly integrated, for example, an embedded dynamic random access memory (EDRAM), the capacitance of a capacitor would otherwise decrease because of its smaller available electrode surface area. However, a relatively large capacitance is desired to prevent loss of stored information. Therefore, increasing the depth d of the trench 30 in accordance with the present invention increases the surface area of the first and second electrodes 36, 40. This advantageously increases the capacitance of the capacitor 20.

The illustrated interconnection line 26 is a multilayer interconnect line formed on an insulating layer 42. The insulating layer 42 is formed on or above the semiconductor substrate 24. The semiconductor substrate 24 contains a plurality of active devices, such as transistors, which are connected together into functional circuits by the interconnection line 26.

The illustrated multilayer interconnection line 26 includes a conductive capping layer 44, a conductor portion 46, and an electromigration barrier layer 48. The conductive capping layer 44 and the electromigration barrier layer 48 are preferably a refractory metal compound, and the conductor portion 46 is preferably an aluminum or copper alloy, for example. Additionally, an anti-reflective coating (ARC) 50, such as titanium nitride, may be formed on the interconnection line 26.

The integrated circuit capacitor 20 is electrically connected to the interconnection line 26 by the metal plug 32. The metal plug 32 preferably comprises tungsten or any suitable, electrically conductive material such as aluminum, titanium or titanium nitride. An important feature of the present invention is that the metal plug 32 is anchored adjacent the lower portions of the first dielectric layer 28 to prevent the plug from becoming loose and separating from the underlying interconnection line 26. The metal plug 32 has a body portion 34 having a first width which extends through the first dielectric layer 28, the ARC layer 50, and the capping layer 44. The enlarged width portion 23 of the anchor portion 22 has a second width wider than the first width. The enlarged width portion 23 of the anchor portion 22 preferably has a convex shape. However, other shapes are acceptable as long as the enlarged width portion 23 extends beyond the body portion 34 of the metal plug 32.

The anchor portion 22 is formed within and surrounded by the interconnection line 26. In other words, the anchor portion 22 does not rest on the outer surface of the interconnection line 26. The enlarged width portion 23 of the anchor portion 22 undercuts the capping layer 44 of the interconnection line 26 within a range of about 100 to 600 angstroms. The amount of undercutting must be sufficient to anchor the body portion 34 of the metal plug 32 while still allowing high density placement of other metal plugs above the semiconductor substrate 24. A width of the body portion 34 of the metal plug 32 is typically in a range of about 1,000 to 3,500 angstroms. The relationship of the enlarged width portion 23 of the anchor portion 22 to the width of the body portion 34 of the metal plug 32 is such that the enlarged width portion is greater than about 10% of the width of the body portion 34.

Additionally, the anchor portion 22 extends to a depth beneath the capping layer 44 sufficient to lock the body portion 34 of the metal plug 32 securely in place. The anchor portion 22 also does not extend into the electromigration shunt layer 50 so that the electromigration resistance of the interconnection line 26 is impeded. The metal plug 32 extends into the conductor portion 46 preferably in a range from about 500 to 3,500 angstroms. The conductor portion 46 typically has a thickness in a range of about 3,500 to 5,500 angstroms. The exact depth at which the anchor portion 22 extends into the conductor portion 46 is not critical as long as the anchor portion 22 extends deep enough into the conductor portion to provide sufficient strength to lock the body portion 34 of the metal plug 32 into place.

As previously discussed, the capacitance of the capacitor 20 is increased by forming a trench 30 in the first dielectric layer 28. The body portion 34 of the metal plug 32 extends upwardly in a medial portion of the trench 30. The trench 30 is patterned, e.g., by conventional etching or other suitable techniques. For example, an etch stop 66 (FIG. 5), such as silicon nitride, is formed within the first dielectric layer 28 during its formation. Accordingly, the etch stop 66 determines the actual depth d of the trench 30. A method of making the integrated circuit capacitor 20 including the anchor portion 22 of the metal plug 32 will be discussed in greater detail below.

With only a body portion 34 of the metal plug 32, i.e., no anchor portion 22, the depth d of the trench 30 is typically limited to about half the thickness of the first dielectric layer 28. If the first dielectric layer 28 has a thickness in a range of about 4,000 to 6,000 angstroms, the depth d of the trench 30 would not exceed 2,000 to 3,000 angstroms. However, with the anchor portion 22 locking the body portion 34 of the metal plug 32 adjacent the lower portions of the first dielectric layer 28, the depth d of the trench 30 can be greater than half the thickness of the first dielectric layer. Accordingly, the increased depth d of the trench 30 can now be in a range of about 2,000 to 5,500 angstroms.

Once the trench 30 has been formed, the capacitor 20 is then formed. The first electrode 36 lines the trench 30 and contacts the metal plug 32. The first electrode 36 is made from any material suitable for conducting and holding an electric charge. Suitable materials include titanium, titanium nitride, aluminum, copper, silver or noble metals such as gold, platinum and/or palladium. The thickness of the first electrode 36 is preferably in a range of about 75 to 750 angstroms. It is also possible for the first electrode 36 to have a multi-layered arrangement, e.g., a layer of titanium coated with a layer of titanium nitride.

The second dielectric layer 38 overlies the first electrode 36 and is formed from any suitable dielectric, e.g., silicon dioxide, silicon nitride and/or any material or alloy of material having a suitably large dielectric constant. Other suitable materials include tantalum pentoxide and barium strontium titantate. The thickness of the second dielectric layer 38 is preferably in a range of about 25 to 250 angstroms.

The second electrode 40 overlies the second dielectric layer 38. Like the first electrode 36, the second electrode 40 is capable of being made from any material suitable for conducting and holding an electric charge. The thickness of the second electrode 40 is preferably in a range of about 150 to 2,500 angstroms. It is also possible for the second electrode 40 to have a multi-layered arrangement, or even an arrangement whereby a first material, such as aluminum, is doped with a second material, such as copper or silicon.

A method for making the integrated circuit capacitor 20 including a metal plug 32 as described above will now be further discussed with reference to FIGS. 2–5. A dielectric layer 42 may be formed, for example, on a semiconductor substrate 24. The semiconductor substrate 24 is preferably silicon, or may be silicon or a polysilicon layer or structure formed on the substrate. A plurality of devices, such as transistors (not shown), are formed in the substrate 24 using well known techniques. Next, the dielectric layer 42, such as a doped or undoped silicon dioxide, is formed over the substrate 24 with well known techniques, such as being thermally grown or being deposited.

Next, the interconnection line 26 is formed on the dielectric layer 42. In formation of the interconnection line 26, a titanium layer 48 of approximately 250 angstroms is formed over the dielectric layer 42 using well known techniques, such as sputtering. Although a titanium layer is preferred, other refractory metal layers can be used. An approximately 4,500 angstrom thick aluminum alloy layer 46 comprising approximately 1% copper is formed on the titanum layer using well known techniques, such as puttering. The aluminum alloy layer 46 is also referred to as the conductor portion. Although an aluminum alloy layer is preferred because of its low resistivity and its well known processes, other low resistance materials may act as the conductor portion 46 in the interconnection line 26, as will be appreciated by one skilled in the art. A layer of titanium 44 approximately 250 angstroms thick is formed on the conductor portion 46 by sputtering. Although titanium is preferred, other refractory metal layers may be used. An anti-reflective coating 50, such as titanium nitride, is formed over the titanium layer 44.

The first dielectric layer 28, such as a doped silicon dioxide, is formed over the interconnection line 26. Any well known technique can be used to form the first dielectric layer 28, such as chemical vapor deposition (CVD). The first dielectric layer 28 is preferably planarized at this time by chemical-mechanical polishing or by etch back to form a planar top surface. The resulting thickness of the first dielectric layer 28 should be thick enough after planarization to provide adequate electrical isolation of the interconnection line 26 from a subsequent level of metalization. An approximate thickness of 4,000 to 6,000 angstroms for the first dielectric layer 28 provides suitable isolation.

Figure 2:
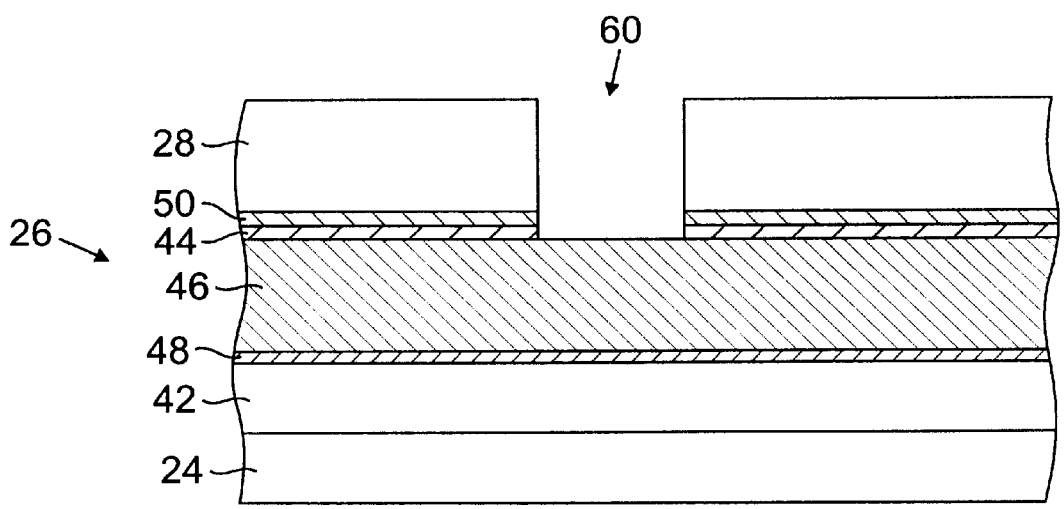
FIGS. 2–5 are cross-sectional views illustrating the process steps for making an integrated circuit capacitor including an anchored metal plug in accordance with the preset invention.

A photoresist layer (not shown) is formed and patterned over the first dielectric layer 28 using well known photolithography techniques to define the location where the via 60 is to be formed. Next, the exposed portions of the first dielectric layer 28, the titanium nitride layer 50, and the titanium layer 44 are etched. The via 60 is etched until the aluminum conductor portion 46 is exposed, as shown in FIG. 2. In one embodiment, a reactive ion etch (RIE) is used to form the via 60.

Figure 3:
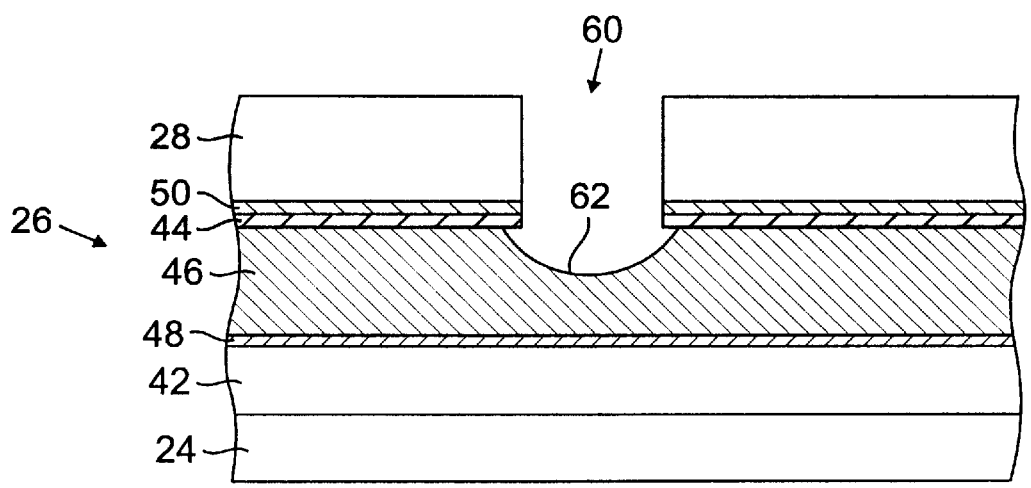

Referring now to FIG. 3, the anchor hole 62 is formed in the aluminum conductor portion 46 of the interconnection line 26 using an isotropic wet etch. The isotropic wet etch is highly selective to the conductor portion 46 with respect to the capping layer 44. In other words, the conductor portion 46 is etched at a faster rate than the capping layer 44. In this way, the conductor portion 46 is laterally etched away beneath the capping layer 44 forming a convex shape, which undercuts the capping layer. The enlarged width portion 23 of the anchor portion 22 undercuts beneath the capping layer preferably in a range of about 100 to 600 angstroms. Other techniques may be utilized for forming the anchor hole 62, including a dry etching technique such as reactive ion etching (RIE), and plasma etching can be used, as will be appreciated by one skilled in the art.

Figure 4:
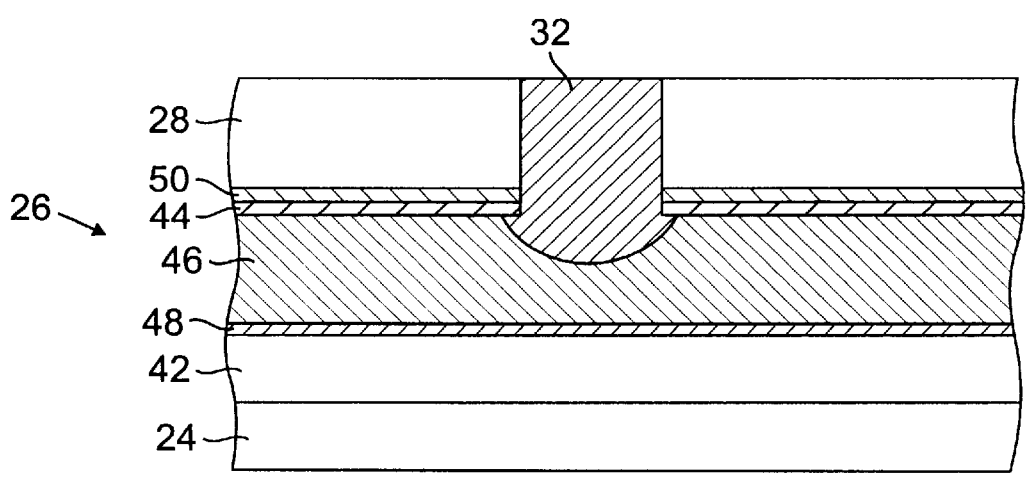

Referring now to FIG. 4, the via 60 is filled with a conductive material, preferably tungsten, using well known techniques for forming the metal plug 32. The anchor and body portions 22, 34 of the metal plug 32 are integrally formed as a monolithic unit. Prior to forming the metal plug 32, a thin adhesion/barrier layer, such as titanium or titanium nitride (not shown), are blanket deposited over the first dielectric layer 28 and into the via 60 and the anchor hole 62 using well known techniques, such as sputtering. The conductive material of the metal plug 32 is then deposited into the via 60 until the anchor hole and via 62, 60 are filled. A chemical-mechanical polishing technique is used to etch back the adhesion/barrier metals and the conductive material deposited on the first dielectric layer 28. Other well known etch back techniques can be used, such as reactive ion etching (RIE).

Figure 5:
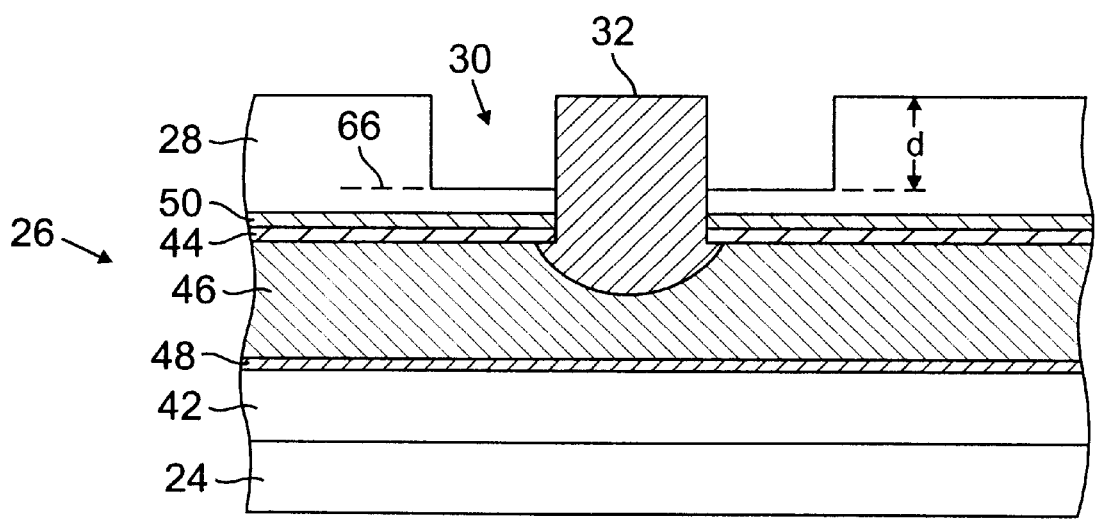

A trench 30 is now formed adjacent the metal plug 32, as best shown in FIG. 5. The trench 30 is formed by patterning adjacent the metal plug 32 using conventional etching or other suitable techniques. For example, a silicon nitride etch stop 66 is formed within the first dielectric layer 28 during its formation. Accordingly, the etch stop 66 determines the actual depth d of the trench 30. Because the metal plug 32 is anchored adjacent the lower portions of the first dielectric layer 28, positioning of the etch stop 66 can be greater without the metal plug becoming loose and separating from the underlying interconnection line 26. This advantageously allows the capacitance of the capacitor 20 to be increased because of the increased surface area available for forming the capacitor.

Once the trench 30 has been formed, the first electrode 36 of the capacitor 20 is formed by depositing an electrically conductive material on the first dielectric layer 28, including the trench 30 and the metal plug 32. Methods of depositing the first electrode 36 may include sputtering, reactive sputter etching (RSE), chemical vapor deposition (CVD) and plasma enhanced chemical vapor deposition (PECVD). The first electrode 36 is then selectively patterned.

The second dielectric layer 38 is deposited over the first electrode 36 and patterned using an appropriate technique. The second dielectric layer 38 may be deposited using CVD or any of the other techniques similar those used for depositing the first electrode 36. The second electrode 40 is then selectively patterned by an appropriate patterning technique.

The capacitor 20 thus includes the first and second electrodes 36, 40 and the second dielectric layer 38 therebetween, as shown in FIG. 1.

As an alternative to forming the capacitor 20 comprising the second dielectric layer 38 between the lower and upper electrodes 36, 40, the lower electrode is replaced by the upper portion of the metal plug 32. In other words, the upper portion of the metal plug 32 forms the lower electrode for the capacitor 20, as readily understood by one skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit capacitor comprising the steps of:
    forming an interconnection line adjacent a substrate;
    forming a first dielectric layer on the interconnection line;
    forming a first opening in the first dielectric layer;
    forming a second opening in the interconnection line aligned with the first opening and having an enlarged width portion greater than a width of the first opening;
    filling the first and second openings with a conductive metal to define a metal plug having a body portion and an anchor portion adjacent lower portions of the first dielectric layer;
    forming a trench in the first dielectric layer adjacent the body portion of the metal plug;
    forming a second dielectric layer adjacent an upper portion of the metal plug; and
    forming an upper electrode on the second dielectric layer.

2. A method according to claim 1, further comprising the step of forming an electrode between the metal plug and the second dielectric layer.

3. A method according to claim 1, wherein the step of filling the first and second openings comprises filling the first and second openings so that the body and anchor portions are integrally formed as a monolithic unit.

4. A method according to claim 1, wherein the step of forming the trench comprises forming the trench to have a depth greater than about half a thickness of the first dielectric layer.

5. A method according to claim 1, wherein the step of forming the enlarged width portion comprises forming the enlarged width portion to have a width greater than about 10% of a width of the first opening.

6. A method according to claim 1, wherein the step of forming the first opening comprises etching the first dielectric layer.

7. A method according to claim 1, wherein the step of forming the second opening comprises etching the first dielectric layer.

8. A method according to claim 1, wherein the step of forming the second opening comprises isotropically etching the interconnection line.

9. A method according to claim 1, wherein the step of forming the enlarged width portion comprises forming the enlarged width portion to have a convex shape.

10. A method according to claim 1, wherein the step of forming the trench comprises forming the trench to have a depth greater than about 2,000 angstroms.

11. A method according to claim 1, further comprising the step of making an uppermost surface of the metal plug substantially co-planar with an adjacent uppermost surface of the first dielectric layer.

12. A method according to claim 1, wherein the metal plug comprises tungsten.

13. A method according to claim 1, wherein the step of forming the trench comprises forming the trench so that the body portion of the metal plug extends upwardly in a medial portion of the trench.

14. A method for making an integrated circuit capacitor comprising the steps of:
    forming a first dielectric layer adjacent a substrate and having a trench therein;
    forming a metal plug comprising
        a body portion extending upwardly into the trench, and
        an anchor portion connected to the body portion and having an enlarged width portion to anchor the metal plug adjacent lower portions of the first dielectric layer;
    forming a second dielectric layer adjacent an upper portion of the metal plug; and
    forming an upper electrode on the second dielectric layer.

15. A method according to claim 14, further comprising the step of forming an electrode between the metal plug and the second dielectric layer.

16. A method according to claim 14, wherein the step of forming metal plug comprises forming the metal plug so that the body and anchor portions are integrally formed as a monolithic unit.

17. A method according to claim 14, wherein the step of forming the trench comprises forming the trench to have a depth greater than about half a thickness of the first dielectric layer.

18. A method according to claim 14, wherein the step of forming the metal plug comprising an enlarged width portion comprises forming the enlarged width portion to have a width greater than about 10% of a width of the first opening.

19. A method according to claim 14, wherein the step of forming the metal plug comprises etching a first opening in the first dielectric layer corresponding to the body portion of the metal plug.

20. A method according to claim 14, further comprising the step of forming an interconnection line extending below the first dielectric layer and connected to the metal plug.

21. A method according to claim 20, wherein the step of forming the metal plug comprises etching a second opening in the interconnection line corresponding to the anchor portion of the metal plug.

22. A method according to claim 21, wherein the step of etching comprises isotropically etching of the interconnection line.

23. A method according to claim 14, wherein the step of forming the metal plug comprising the anchor portion comprises forming the anchor portion so that the enlarged width portion has a convex shape.

24. A method according to claim 14, further comprising the step of forming an interconnection line extending below the first dielectric layer and connected to the metal plug; and wherein the step of forming the metal plug comprises:
    forming a first opening in the first dielectric layer; and
    forming a second opening in the interconnection line aligned with the first opening and having an enlarged width portion greater than a width of the first opening.

25. A method according to claim 14, wherein the step of forming the first dielectric layer comprises forming the first dielectric layer so that the trench has a depth greater than about 2,000 angstroms.

26. A method according to claim 14, further comprising the step of making an uppermost surface of the metal plug substantially co-planar with an adjacent uppermost surface of the first dielectric layer.

27. A method according to claim 14, wherein the metal plug comprises tungsten.

28. A method according to claim 14, wherein the step of forming the first dielectric layer comprises forming the trench so that the body portion of the metal plug extends upwardly in a medial portion of the trench.

29. A method for making an integrated circuit capacitor comprising the steps of:
   forming a first dielectric layer adjacent a substrate and having a trench therein, the trench having a depth greater than about half a thickness of the first dielectric layer;
   forming a metal plug comprising
      a body portion extending upwardly into the trench, and
      an anchor portion connected to the body portion and having a convex-shaped enlarged width portion to anchor the metal plug adjacent lower portions of the first dielectric layer;
   forming a second dielectric layer adjacent an upper portion of the metal plug; and
   forming an upper electrode on the second dielectric layer.

30. A method according to claim 29, further comprising the step of forming an electrode between the metal plug and the second dielectric layer.

31. A method according to claim 29, wherein the step of forming metal plug comprises forming the metal plug so that the body and anchor portions are integrally formed as a monolithic unit.

32. A method according to claim 29, wherein the step of forming the metal plug comprising an enlarged width portion comprises forming the enlarged width portion to have a width greater than about 10% of a width of the first opening.

33. A method according to claim 29, wherein the step of forming the metal plug comprises etching a first opening in the first dielectric layer corresponding to the body portion of the metal plug.

34. A method according to claim 29, further comprising the step of forming an interconnection line extending below the first dielectric layer and connected to the metal plug.

35. A method according to claim 34, wherein the step of forming the metal plug comprises etching an opening in the interconnection line corresponding to the anchor portion of the metal plug.

36. A method according to claim 35, wherein the step of etching comprises isotropically etching of the interconnection line.

37. A method according to claim 29, further comprising the step of forming an interconnection line extending below the first dielectric layer and connected to the metal plug; and wherein the step of forming the metal plug comprises:
   forming a first opening in the first dielectric layer; and
   forming a second opening in the interconnection line aligned with the first opening and having an enlarged width portion greater than a width of the first opening.

38. A method according to claim 29, wherein the step of forming the first dielectric layer comprises forming the first dielectric layer so that the trench has a depth greater than about 2,000 angstroms.

39. A method according to claim 29, further comprising the step of making an upper most surface of the metal plug substantially co-planar with an adjacent uppermost surface of the first dielectric layer.

* * * * *

UNITED STATES PATENT AND TRADEMARK OFFICE
CERTIFICATE OF CORRECTION

PATENT NO.     : 6,169,010 B1                                               Page 1 of 1
DATED          : January 2, 2001
INVENTOR(S)    : Gregg Sumio Higashi It is certified that error appears in the above-identified patent and that said Letters Patent is hereby corrected as shown below:

Related U.S. Application Data,
Insert -- (60)    Provisional application No. 60/117,186, filed on Jan. 26, 1999 --

Column 1,
Line 8, delete, "No. 60/TBD", insert -- No. 60/117, 186 --

Signed and Sealed this

Twenty-fifth Day of September, 2001

Attest:

NICHOLAS P. GODICI
Attesting Officer    Acting Director of the United States Patent and Trademark Office